(12) United States Patent
Tseng et al.

(10) Patent No.: US 11,004,630 B2
(45) Date of Patent: May 11, 2021

(54) BUTTON ASSEMBLY

(71) Applicant: Cheng Uei Precision Industry Co., Ltd., New Taipei (TW)

(72) Inventors: Chi-Ming Tseng, New Taipei (TW); Tsung-Shih Lee, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/675,215

(22) Filed: Nov. 5, 2019

(65) Prior Publication Data
US 2020/0243283 A1 Jul. 30, 2020

(30) Foreign Application Priority Data
Jan. 30, 2019 (TW) .................................. 108201507

(51) Int. Cl.
| | |
|---|---|
| *H01H 23/14* | (2006.01) |
| *G05G 1/02* | (2006.01) |
| *G05G 5/05* | (2006.01) |
| *H01H 23/08* | (2006.01) |
| *G05G 5/04* | (2006.01) |

(52) U.S. Cl.
CPC ............... *H01H 23/14* (2013.01); *G05G 1/02* (2013.01); *G05G 5/04* (2013.01); *G05G 5/05* (2013.01); *H01H 23/08* (2013.01); *G05G 2505/00* (2013.01)

(58) Field of Classification Search
CPC ............ H01H 23/14; G05G 1/02; G05G 5/04; G05G 5/05

USPC .......................................... 200/5 A, 339, 343
See application file for complete search history.

(56) References Cited

U.S. PATENT DOCUMENTS

| | | | | |
|---|---|---|---|---|
| 5,964,341 A | * | 10/1999 | Tsai ........................ | H01H 3/125 200/344 |
| 6,726,093 B2 | * | 4/2004 | Hsu ......................... | H01H 3/125 235/375 |
| 7,041,923 B2 | * | 5/2006 | Lin ......................... | H01H 3/122 200/296 |
| 2007/0119696 A1 | * | 5/2007 | Lu ........................... | H01H 3/125 200/50.36 |
| 2009/0229959 A1 | * | 9/2009 | James ..................... | H01H 23/20 200/339 |

* cited by examiner

*Primary Examiner* — Edwin A. Leon
*Assistant Examiner* — Iman Malakooti
(74) *Attorney, Agent, or Firm* — Cheng-Ju Chiang

(57) ABSTRACT

A button assembly is disposed in a rocker. The button assembly including a base, a pressure sensor and a keycap. The base has two lower pivoting portions with each of the two lower pivoting portions protruding outwardly from respective sides of the base. The pressure sensor is mounted on the base. The keycap overlies the pressure sensor. The keycap has two upper pivoting portions with each of the two upper pivoting portions protruding outwardly from respective sides of the keycap. The two lower pivoting portions are pivoted with the two upper pivoting portions to allow the two upper pivoting portions to be rotatable relative to the two lower pivoting portions. As described above, a push-button structure is thus formed by the two lower pivoting portions and the two upper pivoting portions configured among the base, the pressure sensor and the keycap to achieve the modularization of the button assembly.

5 Claims, 6 Drawing Sheets

BUTTON ASSEMBLY

BACKGROUND OF THE INVENTION

1. Field of the Invention

The present invention is submitted based on application No. 108201507 of Jan. 30, 2019 as priority in Taiwan, incorporated herein by reference in its entirety. The present invention generally relates to a button assembly, and more particularly to a button assembly capable of being modularized.

2. Related Arts

Conventionally, components of a joystick include a top cover and a pressure sensor. The pressure sensor usually takes advantage of the charge of a pressure sensing element or of a flexible printed circuit (FPC) for operation, which means the harder a user's finger presses, the broader a pressed area is defined. The FPC can sense the pressed area and convert it into numbers which are consequently converted into a value indicating the magnitude of the pressing force. In structure, the top cover has a button. In assembly, the pressure sensor is mounted below the top cover. When in use, the user presses the button and the button is thus pushed downward to contact with a top surface of the pressure sensor, and the pressure sensor is then pushed downward. The pressing operation of the button is completed.

However, a kind of pressure sensor made of soft foam material has been imported. This kind of pressure sensor made of soft foam material has higher sensitivity, which may cause a drastic change in variation of the described value when the button is pressed due to the influence of an accumulated tolerance produced in structure. Furthermore, once the button breaks down, it is hard to determine whether it is resulted from the pressure sensor or other components. Besides, broken components in structure are not easy to be replaced.

Therefore, it is necessary to provide a modularized button assembly to make the pressure sensor made of soft foam material produce less accumulated tolerance during pressing operation and to facilitate component replacement as well as performance detection in structure of the joystick.

SUMMARY OF THE INVENTION

An object of the present invention is to provide a button assembly, capable of being modularized.

To attain this, a button assembly is disclosed. The button assembly is disposed in a joystick. The button assembly includes a base, a pressure sensor and a keycap. A middle of the base has an accommodating groove. The base has two lower pivoting portions with each of the two lower pivoting portions protruding outwardly from respective sides of the base. The pressure sensor is mounted in the accommodating groove of the base. The keycap overlies the pressure sensor. A bottom surface of the keycap has a contact portion. The contact portion is engaged with a top surface of the pressure sensor. The keycap has two upper pivoting portions with each of the two upper pivoting portions protruding outwardly from respective sides of the keycap. The two lower pivoting portions are pivoted with the two upper pivoting portions to enable the two upper pivoting portions to be rotatable relative to the two lower pivoting portions.

As described above, a push-button structure is thus formed by the two lower pivoting portions and the two upper pivoting portions configured among the base, the pressure sensor and the keycap to achieve the modularization of the button assembly of the present invention. When a user presses the button assembly of the present invention, the keycap is utilized to transmit pressure to the pressure sensor, which generates less accumulated tolerance compared to conventional button structure. Also, the modularized structure of the present invention is beneficial to the assembly into other compatible carriers as well as convenient for replacement.

DESCRIPTION OF THE PREFERRED EMBODIMENTS

Figure 1:
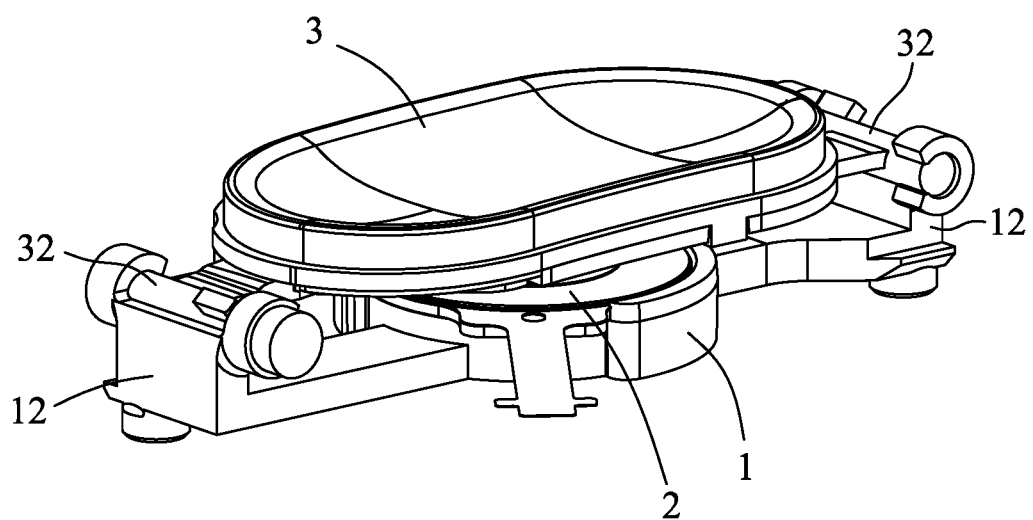
FIG. 1 is a perspective view of button assembly in accordance with the present invention.
Figure 2:
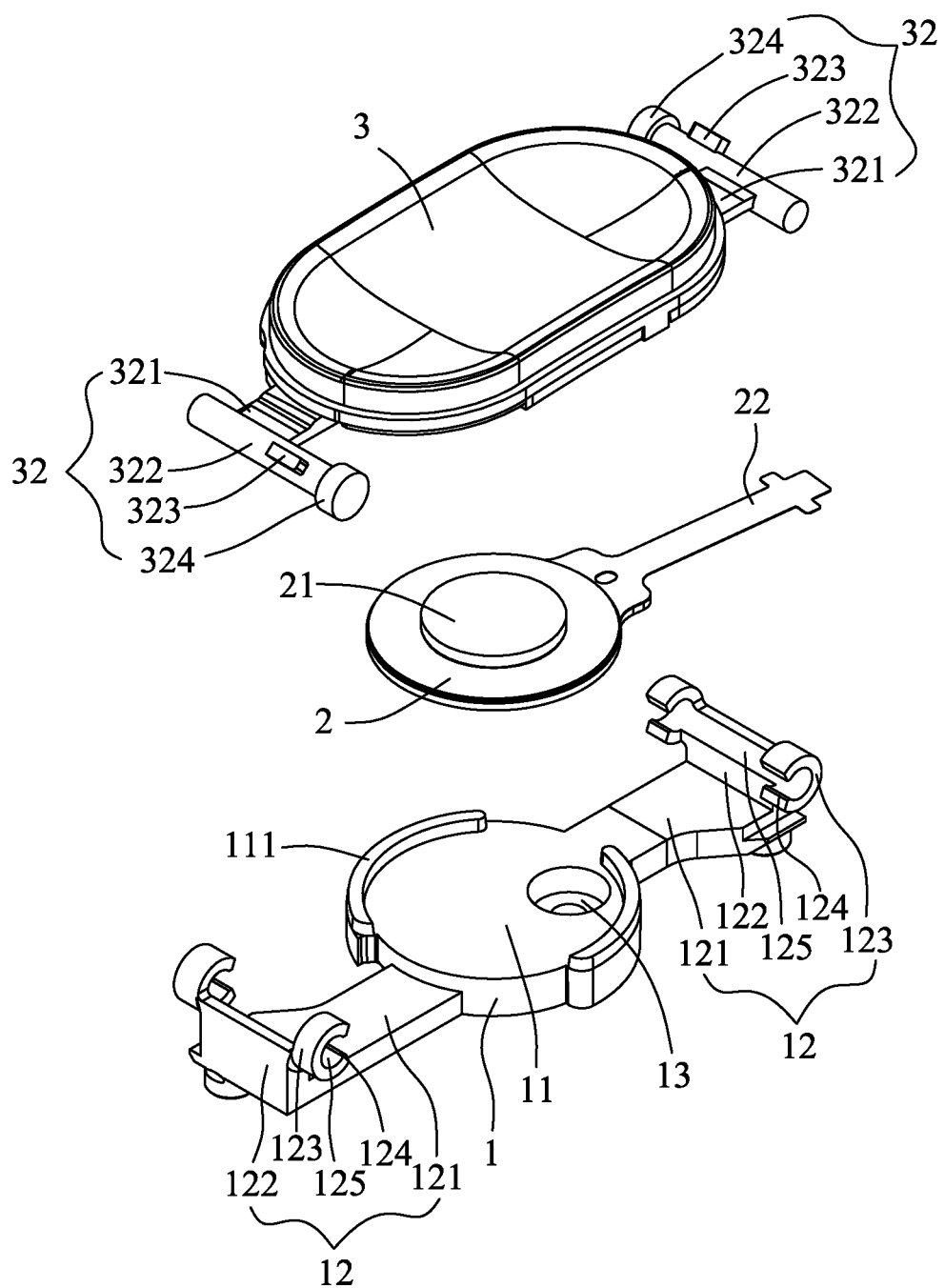
FIG. 2 is an exploded perspective view of FIG. 1.
Figure 3:
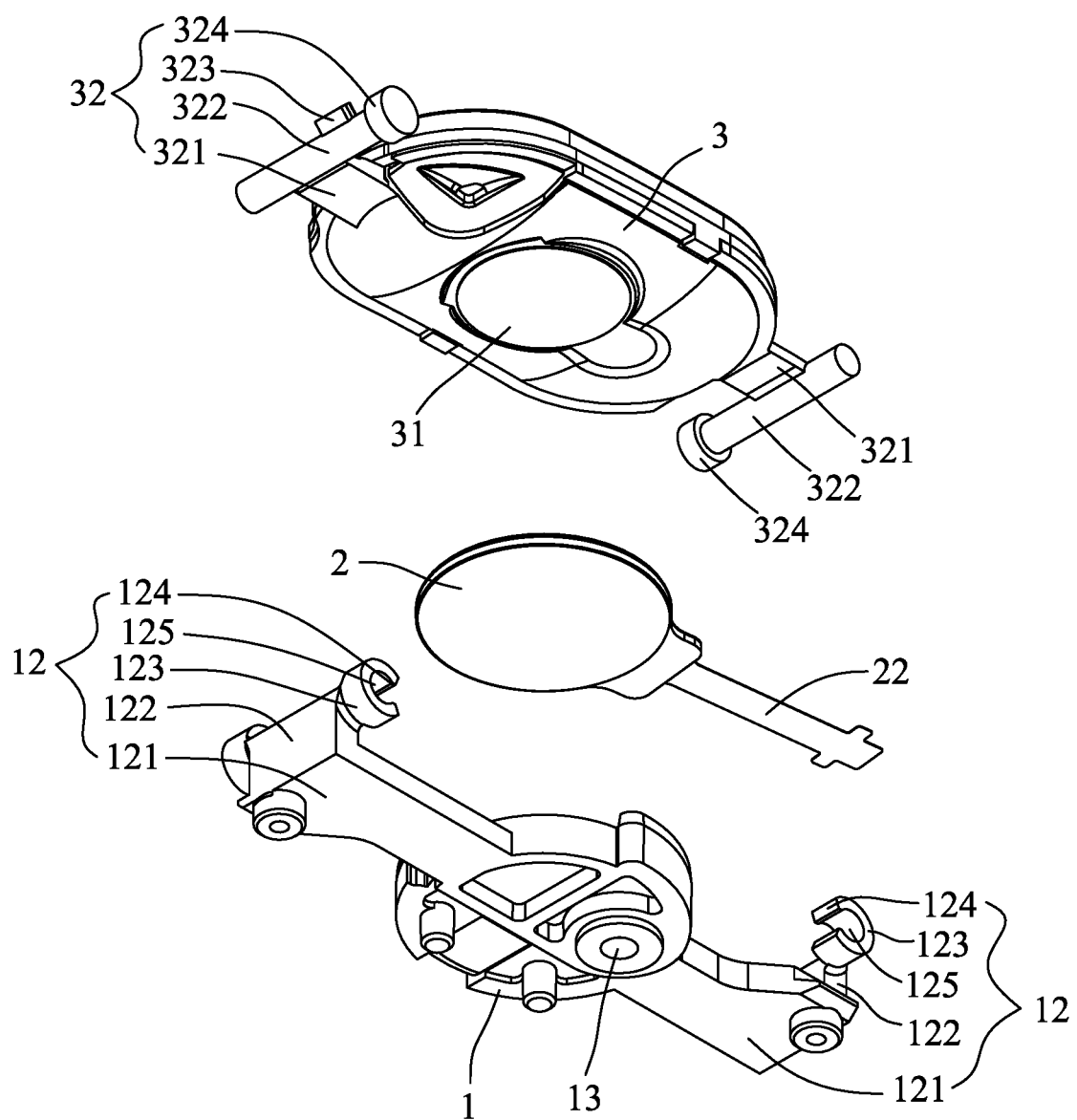
FIG. 3 is an exploded perspective view of FIG. 2 at a different view angle.

Referring to FIG. 1 to FIG. 3, a button assembly 100 in accordance with the present invention includes a base 1, a pressure sensor 2 and a keycap 3. An outer edge of the base 1 has a plurality of stop blocks 111. The plurality of the stop blocks 111 protrude upwardly to form an accommodating groove 11 therebetween on a middle of the base 1. The base 1 has two lower pivoting portions 12 with each of the two lower pivoting portions 12 protruding outwardly from respective sides of the base 1. Each of the two lower pivoting portions 12 includes a lower extension part 121, a flange 122 and two locking blocks 123. A side of the base 1 extends outwardly to form the lower extension part 121. An end of the lower extension part 121 protrudes upwardly to form the flange 122. Free ends of the flange 122 further respectively protrude upwardly to form the two locking blocks 123. Each of the two locking blocks 123 has a notch 124. The flange 122 and the two locking blocks 123 are partially recessed to form a pivoting groove 125. The notch 124 connects with the pivoting groove 125. A positioning hole 13 penetrating longitudinally throughout the base 1 is formed.

The pressure sensor 2 is mounted in the accommodating groove 11 of the base 1 surrounded by the plurality of the stop blocks 111. The pressure sensor 2 includes a sensor element 21 made of soft material. The pressure sensor 2 extends outwardly to form a first capacitor 22.

With reference to FIG. 2 and FIG. 3, the keycap 3 overlies the pressure sensor 2. A bottom surface of the keycap 3 has a contact portion 31. The contact portion 31 is engaged with a top surface of the sensor element 21 made of soft material. The keycap 3 has two upper pivoting portions 32 with each of the two upper pivoting portions 32 protruding outwardly from respective sides of the keycap 3. The two upper pivoting portions 32 are respectively disposed on the two lower pivoting portions 12 in a manner that the two lower pivoting portions 12 are pivoted with the two upper pivoting portions 32 to allow the two upper pivoting portions 32 to be rotatable relative to the two lower pivoting portions 12. Each of the two upper pivoting portions 32 includes an upper extension part 321, a rotation shaft 322, a fixed block 323 and a limit block 324. A side of the keycap 3 extends outwardly to form the upper extension part 321. The upper extension part 321 is located above the lower extension part 121. A free end of each of the upper extension part 321 is mounted with the rotation shaft 322. The rotation shaft 322 is inserted in each of the two locking blocks 123 to be rotatable relative to each of the two locking blocks 123. The rotation shaft 322 protrudes outwardly to form the fixed block 323. An end of the rotation shaft 322 extends outwardly to form the limit block 324. When the two upper pivoting portions 32 are respectively engaged with each of the two lower pivoting portions 12, the rotation shaft 322 is inserted in the pivoting groove 125 through the notch 124 of each of the two locking blocks 123. Meanwhile, the fixed block 323 is abutted against an inner side of one of the two locking blocks 123, and the limit block 324 is abutted against an outer side of the same one of the two locking blocks 123 so as to limit a lateral movement of the rotation shaft 322 in the pivoting groove 125, by which the rotation shaft 322 can be held and rotatable within the pivoting groove 125 and avoid natural loosing after repeated rotations.

The button assembly 100 of the present invention utilizes the sensor element 21 that is made of soft material. The sensor element 21 made of soft material makes the pressure sensor 2 have higher detective sensitivity than the flexible printed circuit (FPC) and the pressure sensing element, which may easily cause a drastic change in variation of the value associated with magnitude of the pressing force during the time that the pressure sensor 2 is pressed. In this regard, the button assembly 100 of the present invention provides the pressure sensor 2 configured between the base 1 and the keycap 3. When a user presses the button assembly 100 of the present invention, the keycap 3 moves downwardly along with the pressing path and drives the upper extension parts 321 to moves downwardly, meanwhile the rotation shafts 322 in the two locking blocks 123 begin to rotate, as a way of the keycap 3 being pressed. Because the rotation shafts 322 of the upper extension parts 321 are respectively fixed on each of the two locking blocks 123, during being pressed down, sides of the two upper pivoting portions 32 fixed with the two locking blocks 123 are not movable and only portions of the upper extension parts 321 adjacent to the keycap 3 can be moved downwardly, which allows an elastic transformation of the upper extension parts 321. At the same time, the upper extension parts 321 generate a rebound force upwardly. Because the sensor element 21 made of soft material inherently has an elasticity, when the sensor element 21 are pushed downwardly by the keycap 3, a spot of the keycap 3 pressed by the user, along with a spot of the sensor element 21 with respect to the spot of the keycap 3 would downwardly form a concave under stress. Meanwhile, the spot of the sensor element 21 produces the rebound force upwardly due to inherent elasticity of the sensor element 21. When the user releases the button assembly 100 of the present invention, the rebound force produced from the elastic transformation of the spots of the upper extension parts 321 is initiated for moving upwardly the portions of the upper extension parts 321 adjacent to the keycap 3, and the sensor element 21 returns to its original state, while the contact portion 31 is pushed to move the keycap 3 upwardly. Meanwhile, the rotation shafts 322 of the two locking blocks 123 begin to rotate to make the keycap 3 return to its original state. One pressing operation is done.

Figure 4:
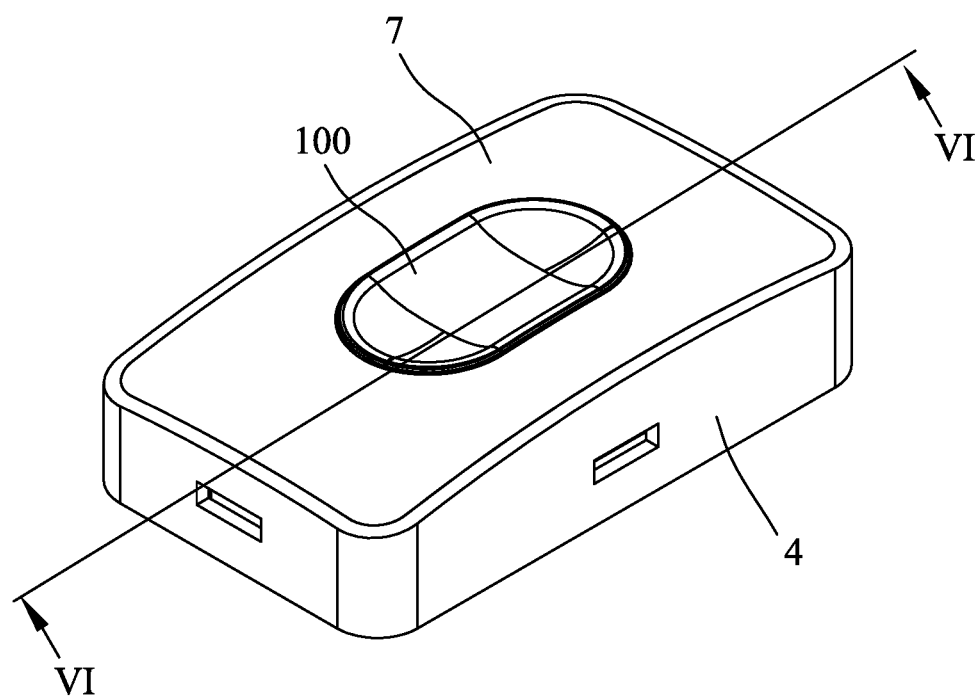
FIG. 4 is a perspective view of a joystick configured with the button assembly of the present invention.
Figure 5:
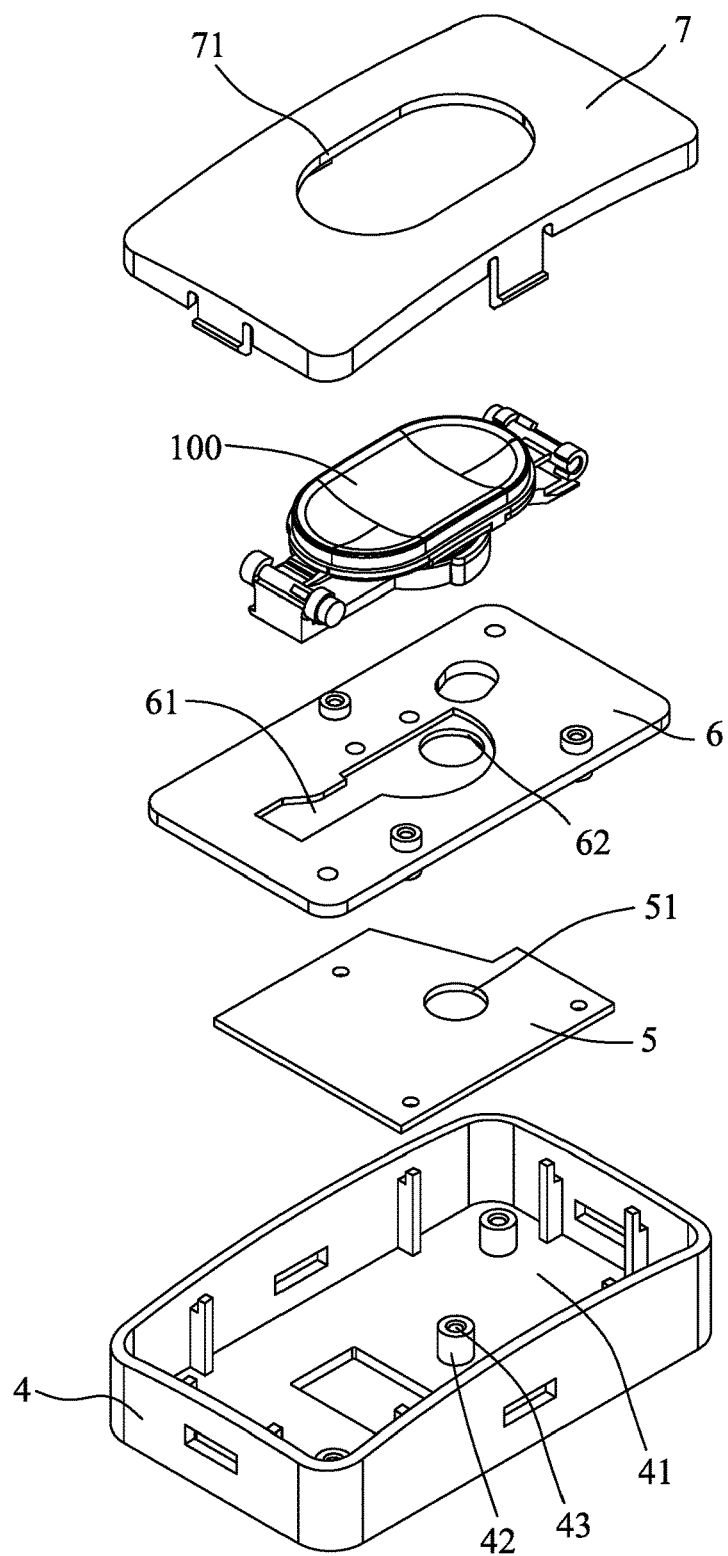
FIG. 5 is an exploded perspective view of FIG. 4.
Figure 6:
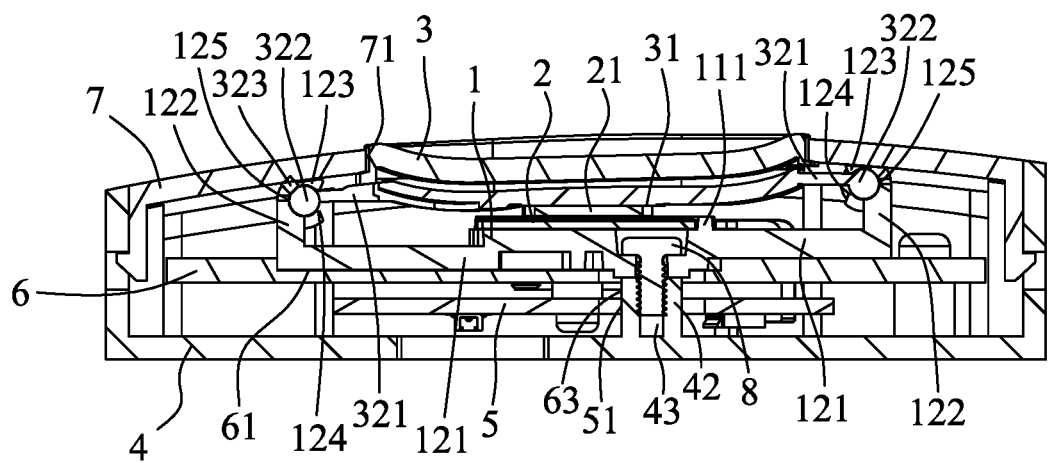
FIG. 6 is a cross-sectional view taken along lines VI-VI of FIG. 4.

With reference to FIG. 4 to FIG. 6, a joystick 200 configured with the button assembly 100 of the present invention is disclosed. The joystick 200 includes an outer shell 4, circuit board 5, a fixed panel 6 and a top cover 7.

The outer shell 4 has an inner space 41. The circuit board 5 and the fixed panel 6 are disposed in the inner space 41. A bottom of the outer shell 4 protrudes upwardly to form a bump 42. A center of the bump 42 is recessed downwardly to form a fixed groove 43. The fixed groove 43 is disposed corresponding to the positioning hole 13 of the base 1 of the button assembly 100.

The circuit board 5 is disposed in the outer shell 4. The circuit board 5 has a first communication opening 51. The first communication opening 51 receives the bump 42 downwardly. The circuit board 5 has a second capacitor (not shown). The fixed panel 6 is disposed above the circuit board 5 and in the outer shell 4. A top surface of the fixed panel 6 is recessed to form a mounting groove 61. A second communication opening 62 is disposed in the mounting groove 61. The second communication opening 62 is connected with the first communication opening 51 and receives the bump 42 downwardly. The top cover 7 is disposed on the outer shell 4 and covers on the circuit board 5 and the fixed panel 6. The top cover 7 has an opening 71 corresponding to the button assembly 100 of the present invention.

The button assembly 100 of the present invention is configured in the joystick 200. The base 1 of the button assembly 100 is mounted in the mounting groove 61 of the fixed panel 6. The fixed groove 43 corresponds to the positioning hole 13 of the base 1 of the button assembly 100. A positioning element 8 is provided to pass through the fixed groove 43 and the positioning hole 13 for fixation. The first capacitor 22 is electrically connected to the second capacitor. The top cover 7 is mounted on the outer shell 4 and covers on the configured circuit board 5, the fixed panel 6 and the button assembly 100 of the present invention with the keycap 3 exposing upwardly from the opening 71, as a way of the configuration of the button assembly 100 of the present invention in the joystick 200.

The button assembly 100 of the present invention integrates the pressure sensor 2 and the keycap 3 to be a unit component, capable of being mounted in any compatible carriers, therefore not limited within the disclosure of the embodiment of the present invention.

As described above, a push-button structure is thus formed by the two lower pivoting portions 12 and the two upper pivoting portions 32 configured among the base 1, the pressure sensor 2 and the keycap 3 to achieve the modularization of the button assembly 100 of the present invention. When a user presses the button assembly 100 of the present invention, the keycap 3 is utilized to transmit pressure to the pressure sensor 2, which generates less accumulated tolerance compared to conventional button structure. Also, the modularized structure of the present invention is beneficial to the assembly into other compatible carriers as well as convenient for replacement.

What is claimed is:

1. A button assembly, disposed in a joystick, the button assembly including:
   a base, a middle of the base having an accommodating groove, the base having two lower pivoting portions with each of the two lower pivoting portions protruding outwardly from respective sides of the base;
   a pressure sensor, mounted in the accommodating groove of the base; and
   a keycap, overlying the pressure sensor, a bottom surface of the keycap having a contact portion, the contact portion being engaged with a top surface of the pressure sensor, the keycap having two upper pivoting portions with each of the two upper pivoting portions protruding outwardly from respective sides of the keycap, the two lower pivoting portions being pivoted with the two upper pivoting portions to enable the two upper pivoting portions to be rotatable relative to the two lower pivoting portions;

wherein each of the two lower pivoting portions includes a lower extension part, a flange and two locking blocks, a side of the base extends outwardly to form the lower extension part, an end of the lower extension part protrudes upwardly to form the flange, free ends of the flange further respectively protrude upwardly to form two locking blocks, each of the two locking blocks has a notch, the flange and the two locking blocks are partially recessed to form a pivoting groove, the notch connects with the pivoting groove.

2. The button assembly of claim 1, wherein each of the two upper pivoting portions includes an upper extension part and a rotation shaft, a side of the keycap extends outwardly to form the upper extension part, the upper extension part is located above the lower extension part, a free end of each of the upper extension part is mounted with the rotation shaft, the rotation shaft is inserted in each of the two locking blocks through the notch to be rotatable relative to each of the two locking blocks.

3. The button assembly of claim 2, wherein the rotation shaft protrudes outwardly to form a fixed block, an end of the rotation shaft extends outwardly to form a limit block, when the rotation shaft is arranged in the pivoting groove, the fixed block is abutted against an inner side of one of the two locking blocks, and the limit block is abutted against an outer side of the same one of the two locking blocks so as to limit a lateral movement of the rotation shaft in the pivoting groove, by which the rotation shaft is held and rotatable within the pivoting groove.

4. The button assembly of claim 1, wherein the pressure sensor includes a sensor element made of soft material, the contact portion of the keycap is engaged with a top surface of the sensor element.

5. The button assembly of claim 1, wherein an outer edge of the base has a plurality of stop blocks, the plurality of the stop blocks extend upwardly to form the accommodating groove therebetween on the middle of the base.

* * * * *